US008236475B2

(12) United States Patent
Sharma et al.

(10) Patent No.: US 8,236,475 B2
(45) Date of Patent: Aug. 7, 2012

(54) METHODS FOR REMOVING A PHOTORESIST FROM A METAL-COMPRISING MATERIAL

(75) Inventors: Balgovind Sharma, Fishkill, NY (US); Ying H. Tsang, Newburgh, NY (US)

(73) Assignee: Advanced Micro Devices, Inc., Austin, TX (US)

(*) Notice: Subject to any disclaimer, the term of this patent is extended or adjusted under 35 U.S.C. 154(b) by 690 days.

(21) Appl. No.: 12/123,049

(22) Filed: May 19, 2008

(65) Prior Publication Data
US 2009/0286385 A1 Nov. 19, 2009

(51) Int. Cl.
*G03C 11/12* (2006.01)
(52) U.S. Cl. ........ 430/256; 430/260; 430/311; 510/176; 438/199; 257/274; 257/369; 257/E27.062
(58) Field of Classification Search .................. 257/204, 257/274, 369, E27.062–E27.067, E21.63–E21.644, 257/E21.245; 438/153, 188, 199, 200–233, 438/585; 216/11; 510/176; 430/256–263, 430/311, 325, 326, 32
See application file for complete search history.

(56) References Cited

U.S. PATENT DOCUMENTS

| 5,368,931 | A | * | 11/1994 | Kato et al. | 428/327 |
| 5,753,601 | A | * | 5/1998 | Ward et al. | 510/176 |
| 2006/0003468 | A1 | * | 1/2006 | DeMuynck et al. | 438/1 |
| 2006/0088666 | A1 | * | 4/2006 | Kobrin et al. | 427/569 |
| 2008/0051308 | A1 | * | 2/2008 | Kane | 510/176 |
| 2008/0191286 | A1 | * | 8/2008 | Chang et al. | 257/369 |
| 2010/0293723 | A1 | * | 11/2010 | Racette et al. | 8/142 |

FOREIGN PATENT DOCUMENTS

JP 2005191587 A * 7/2005

OTHER PUBLICATIONS

Alliance Technical Sales; A Guide to pH Measurement—the theory and practice of laboratory pH applications. pp. 1-52. Available online Mar. 12, 2006: http://wayback.archive.org/web/20060301000000*/http://www.alliancets.com/site/files/408/29497/109873/159912/Guide_to_pH Measurement.pdf.*
RTI International; SAGE-Solvent Alternatives Guide- N-methylpyrolidone. Page of General Information and MSDS. Available online Sep. 28, 2002: http://www.p2pays.org/ref/19/18161/alt.cfm-id=nmp &cat=gi.htm.*
"Challenges With Respect to High-k/Metal Gate Stack Etching and Cleaning", Vos et al., ECS Transactions 11 (4) 275-283 (2007).

* cited by examiner

*Primary Examiner* — N Drew Richards
*Assistant Examiner* — John P Dulka
(74) *Attorney, Agent, or Firm* — Ingrassia Fisher & Lorenz, P.C.

(57) ABSTRACT

Methods for removing a photoresist from a metal-comprising material are provided. In accordance with an exemplary embodiment of the present invention, the method comprises applying to the photoresist a substantially non-aqueous-based solvent having a pH no less than about 9 or no pH and subsequently applying to the metal-comprising material an aqueous-based fluid having a pH no less than about 9.

18 Claims, 2 Drawing Sheets

METHODS FOR REMOVING A PHOTORESIST FROM A METAL-COMPRISING MATERIAL

FIELD OF THE INVENTION

The present invention generally relates to photolithography, and more particularly relates to methods for removing photoresists from metal-comprising materials.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS integrated circuit (IC). There is a continuing trend to incorporate more and more circuitry on a single IC chip. To incorporate the increasing amount of circuitry, the size of each individual device in the circuit and the size and spacing between device elements (the feature size) must decrease.

High dielectric constant materials, also referred to as "high-k dielectrics," such as hafnium dioxide ($HfO_2$), hafnium silicate oxide nitride (HfSiON), or zirconium dioxide ($ZrO_2$), are considered for the 45 nm node technology and beyond to allow further scaling of gate dielectrics. To prevent Fermi-level pinning, metal gates (MG) with the proper work function are used as gate electrodes on the high-k gate dielectrics. Such metal gate electrodes typically are formed of metal-comprising materials such as lanthanum (La), aluminum (Al), magnesium (Mg), titanium-based materials such as titanium nitride (TiN), tantalum-based materials such as tantalum nitride (TaN) or tantalum carbide ($Ta_2C$), and the like. Often, a thin oxide forms on the metal-comprising material when exposed to an ambient environment. The oxide may serve as protection of the metal-comprising material from contamination.

The formation of features, such as gate dielectrics and metal gates, is performed using photolithography. Generally, during photolithography, an image is focused on a wafer to expose and pattern a layer of material, such as a hydrocarbon-based photoresist material, that is deposited on another material layer of the wafer. In turn, the photoresist material is utilized as a mask to define device features, such as gate electrodes, conductive lines, doping regions, or other structures associated with ICs in the material layer of the semiconductor wafer. After a feature is formed, the photoresist is removed from the features.

Photoresist typically is removed using a sulfuric acid/hydrogen peroxide mixture (SPM), propylene glycol methyl ether acetate (PGMEA), or a dry chemistry, such as a plasma. However, these conventional removal methods prove unsatisfactory for the removal of photoresist from metal-comprising material, such as that used to form metal gate electrodes. For example, SPM is an aqueous-based composition with a pH of about 1 and thus results in removal of not only the resist but also the metal-comprising material and any oxide formed thereon. Removal of any portion of the metal-comprising material and its oxide can result in catastrophic effects on MOSFET performance. PGMEA tends to leave residue particles on the metal-comprising material, which may result in a threshold voltage shift of the resulting MOSFET. Dry chemistries typically do not remove all of the photoresist and, thus, have to be followed by wet chemistry etches, such as with SPM or PGMEA, that in turn present the same issues set forth above.

Accordingly, it is desirable to provide a method for removing a photoresist from a metal-comprising material that does not leave residue that may undesirably affect resulting device performance. In addition, it is desirable to provide a method for removing a photoresist from a metal-comprising material that does not remove at least a portion of the metal-comprising material or the oxide formed thereon. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for removing a photoresist from a metal-comprising material is provided in accordance with an exemplary embodiment of the present invention. The method comprises applying to the photoresist a substantially non-aqueous-based solvent having a pH no less than about 9 or no pH and subsequently applying to the metal-comprising material an aqueous-based fluid having a pH no less than about 9.

A method for forming a semiconductor device is provided in accordance with an exemplary embodiment of the present invention. The method comprises depositing a metal-comprising material overlying a substrate and forming a patterned photoresist on the metal-comprising material. The metal-comprising material is etched and the patterned photoresist at least substantially removed from the metal-comprising material using a substantially non-aqueous-based solvent having a pH no less than about 9 or no pH. The metal-comprising material is subjected to an aqueous-based fluid having a pH no less than about 9.

A method for forming a metal-comprising material gate electrode of a MOSFET is provided in accordance with an exemplary embodiment of the present invention. The method comprises depositing a metal-comprising material overlying a high dielectric constant material and forming a patterned photoresist on the metal-comprising material. The metal-comprising material is etched to form a metal-comprising material gate electrode. The patterned photoresist is at least substantially removed from the metal-comprising material using a substantially non-aqueous-based solvent having a pH no less than about 9 or no pH. The metal-comprising material is rinsed and is subjected to an aqueous-based fluid having a pH no less than about 9.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The various embodiments of the methods of the present invention provide for the effective removal of photoresist from a metal-comprising material without removal of some or all of the metal-comprising material or, if present, its oxide. Removal of some or all of the metal-comprising material and/or its oxide can result in the degradation of the electrical characteristics of a resulting device. The method utilizes a two step process. The first step comprises applying to the photoresist a substantially non-aqueous-based solvent having a pH of no less than 9 or no pH. The solvent removes at least substantially all the photoresist but, with a pH of no less than 9 or no pH, does not attack the metal-comprising material or its oxide. The second step comprises applying to the metal-comprising material an aqueous-based fluid having a pH of not less than about 9. The fluid removes any remaining photoresist residue and any organic material or other contaminants on the metal-comprising material and/or its oxide. Because the fluid also has a high pH, a substantially clean surface of the metal-comprising material is provided without any removal of the metal-comprising material or its oxide that can degrade the electrical characteristics of a subsequently-formed device.

FIGS. 1-4 schematically illustrate, in cross section, method steps for the removal of a photoresist from a metal-comprising material of a fabricated semiconductor device 50, in accordance with various embodiments of the invention. For illustration purposes, semiconductor device 50 is shown as a portion of an MOS device. However, it will be appreciated that the various embodiments of the method for removing a photoresist are not so limited and may be used to remove a photoresist from a metal-comprising material of any device feature, such as a conductive interconnect. Various steps in the manufacture of MOS components are well known and so, in the interest of brevity, many conventional steps will only be mentioned briefly herein or will be omitted entirely without providing the well known process details. As used herein, the term "MOS device" properly refers to a device having a gate electrode formed of a metal-comprising material, described in more detail below, and an oxide gate insulator.

Figure 1:
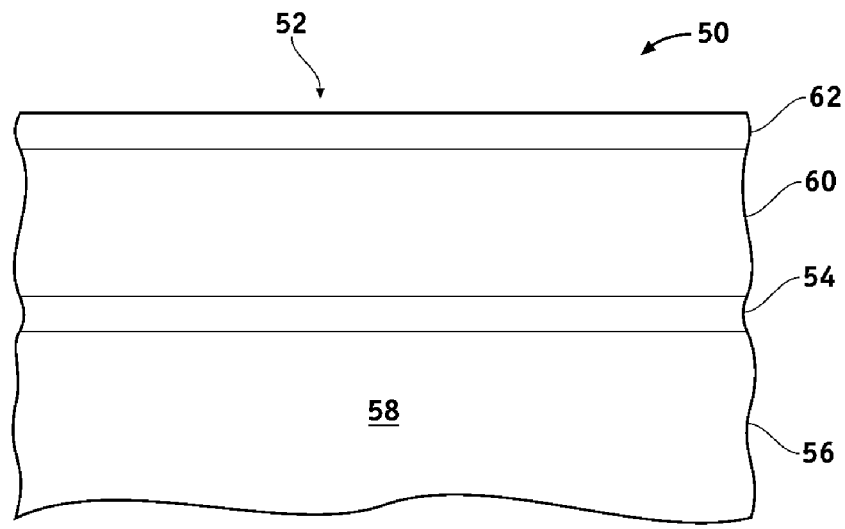
FIGS. 1-4 illustrate schematically, in cross section, a method for fabricating a gate stack of an MOS transistor and the removal of a photoresist therefrom.

Referring to FIGS. 1-4, MOS device 50 includes a plurality of gate stacks of MOS transistors, which can be N-channel or P-channel MOS transistors (NMOS or PMOS, respectively) or a combination of the two transistors, although only one gate stack 52 is shown for brevity. Referring to FIG. 1, gate insulator material 54 is deposited overlying a semiconductor substrate 56. The semiconductor substrate is preferably a silicon substrate wherein the term "silicon substrate" is used herein to encompass the relatively pure silicon materials typically used in the semiconductor industry as well as silicon admixed with other elements such as germanium, carbon, and the like. The silicon substrate may be a bulk silicon wafer, or may be a thin layer of silicon on an insulating layer (commonly know as silicon-on-insulator or SOI) that, in turn, is supported by a carrier wafer. At least a surface 58 of the silicon substrate is impurity doped, for example by forming N-type well regions and P-type well regions for the fabrication of PMOS transistors and NMOS transistors, respectively.

The layer of gate insulating material 54 can be a layer of thermally grown silicon dioxide or, alternatively (as illustrated), a deposited insulator such as a silicon oxide, silicon nitride, a high dielectric constant insulator such as HfSiO, or the like. Deposited insulators can be deposited, for example, by chemical vapor deposition (CVD), low pressure chemical vapor deposition (LPCVD), plasma-enhanced chemical vapor deposition (PECVD), physical vapor deposition (PVD), or atomic layer deposition (ALD). Gate insulating material 54 preferably has a thickness of about 1-10 nm, although the actual thickness can be determined based on the application of the transistor in the circuit being implemented.

A layer of metal-comprising material 60 is formed overlying the gate insulating material 54. The metal-comprising material may be formed of lanthanum (La) or lanthanum alloys, aluminum (Al) or aluminum alloys, magnesium (Mg) or magnesium alloys, titanium-based materials such as titanium nitride (TiN) or titanium aluminum nitride (TiAlN), tantalum-based materials such as tantalum nitride (TaN), tantalum aluminum nitride (TaAlN), or tantalum carbide ($Ta_2C$), or the like. The metal-comprising material may have a thin layer of oxide (not shown) formed thereon, such as by exposure to an ambient environment or other intentional oxidation. The oxide may serve to protect the metal-comprising material 60 from contamination. A layer of photoresist 62 is deposited onto the surface of the metal-comprising material 60. The photoresist may be any conventional hydrocarbon-based photoresist such as photoresist 3435 available from Tokyo Ohka Kogyo Co., Ltd of Japan and EPIC™ 2520 available from Rohm and Haas Electronic Materials of Phoenix, Ariz.

Figure 2:
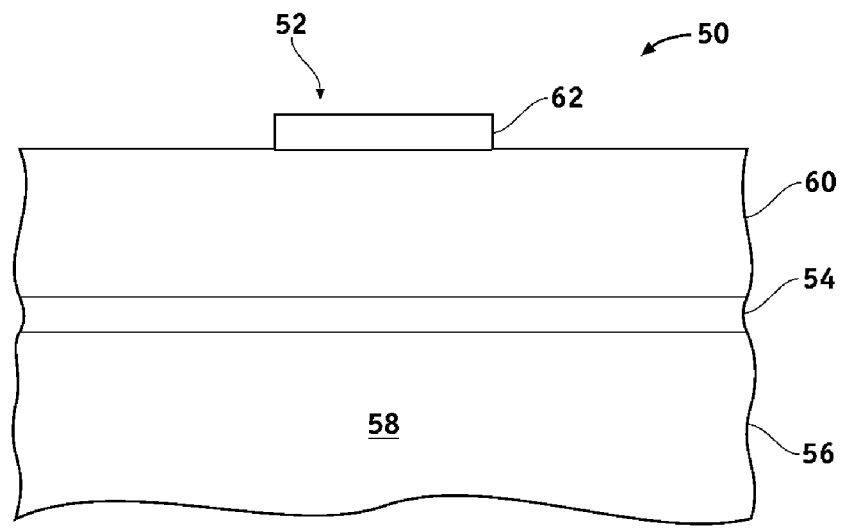
Figure 3:
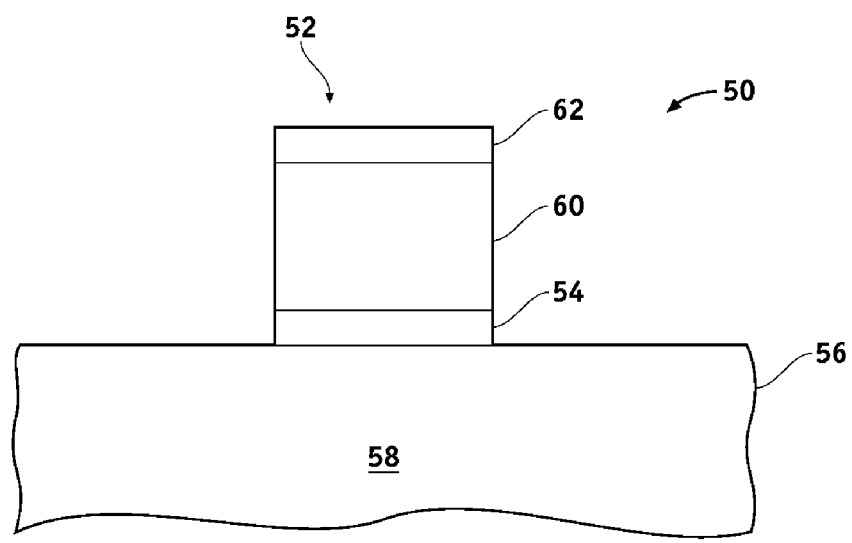

Referring to FIGS. 2 and 3, the photoresist 62 is photolithographically patterned and the underlying metal-comprising material 60 is etched to form gate stack 52. Optionally, as shown in FIG. 3, the gate insulating material 54 also may be etched. The photoresist 62 is etched using, for example, tetramethylammonium hydroxide (TMAH). The metal-comprising material 60 can be etched using, for example, a suitable acid, such as HCL, sulfuric acid, and the like.

Figure 4:
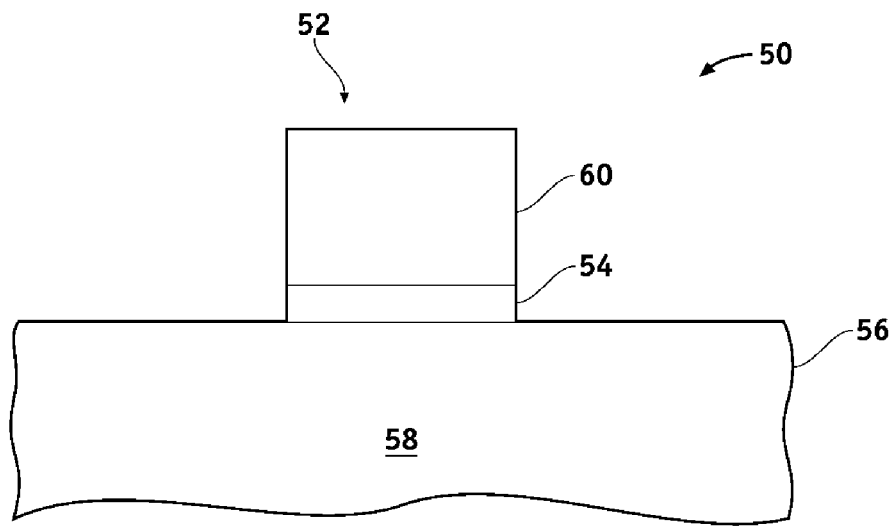
Figure 5:
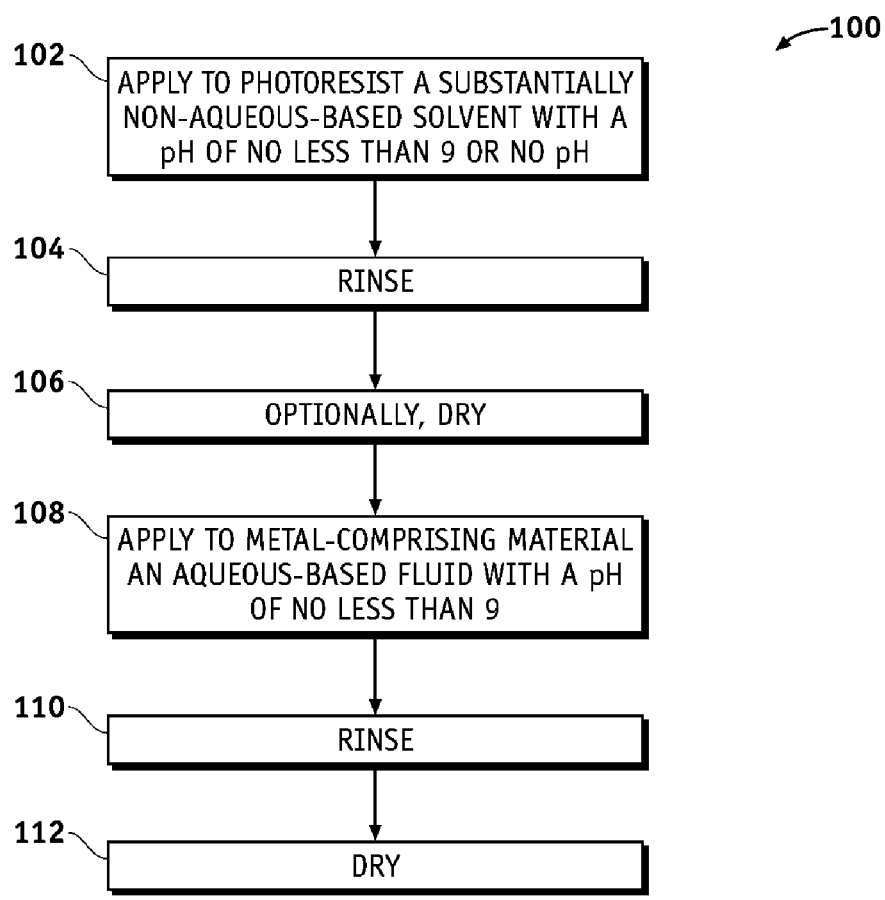
FIG. 5 is a flow diagram of a method for removing a photoresist from a metal-comprising material.

Once gate stack 52 is formed, the photoresist 62 is removed from metal-comprising material 60, as illustrated in FIG. 4. FIG. 5 illustrates a method 100 for removing the photoresist from the metal-comprising material 60. The method begins by exposing the photoresist to a substantially non-aqueous-based solvent that has a pH of no less than about 9 or no pH (step 102). As used herein, the term "substantially non-aqueous-based solvent" means a hydrocarbon-based solvent having no more than about 10% water and a pH of no less than about 9 or a hydrocarbon-based solvent comprising no water and thus having no pH. Use of a substantially non-aqueous-based solvent results in removal of substantially all of the photoresist from the metal-comprising material. By formulating the substantially non-aqueous-based solvent with a pH of no less than about 9 or no pH, integrity of the metal-comprising material and, if present, its oxide are maintained without removal thereof that can result in electrical degradation of the resulting device. The substantially non-aqueous-based solvent is selected based on its wetting characteristics and its solubility characteristics. Preferably, the solvent can "wet" a hydrophobic surface; that is, the solvent evidences a contact angle of no greater than about 45 degrees when deposited on a hydrophobic surface. In another preferred embodiment of the invention, the solvent evidences a Hansen solubility parameter with solubility components that are within about 10% of each other. The Hansen solubility parameter ($\delta$) characterizes solvents according to their solubility components, which measure the strength of the intermolecular forces holding molecules together in a liquid state. The Hansen solubility parameter is defined by the following equation:

$$\delta = \sqrt{\delta_p^2 + \delta_d^2 + \delta_h^2},$$

where $\delta_p$ is the dispersive (sometimes call the non-polar) component, $\delta_d$ is the polar component, and $\delta_h$ is the hydrogen-bonding component. With $\delta_p$, $\delta_d$, and $\delta_h$ within about 10% of each other, the solvent demonstrates strong solubility of a polymer therein. Examples of substantially non-aqueous-based solvents having a pH no less than about 9 or no pH include, but are not limited to, methyl isobutyl ketone (MIBK), cyclohexanone, dichloromethane (DCM), ethyl glycol (EG), polyethylene glycol (PEG), methyl hexanone, N-methylpyrrolidone (NMP) and NMP-comprising solvents such as AZ-400 available from Clariant International Ltd. of Switzerland, and alcohols. The substantially non-aqueous-based solvent also may comprise ethers, fluorides, or other components that may facilitate removal of the photoresist.

The substantially non-aqueous-based solvent may be applied to the photoresist using any conventional technique and/or wet etch tool. For example, the solvent may be applied by dipping the photoresist into a solvent bath of a batch wet etch tool. Alternatively, the solvent may be sprayed or dropped onto a rotating wafer, such as in a spin-on single-wafer tool. To expedite photoresist removal, the solvent can be heated to above room temperature that is, to a temperature above about 15° C. to about 20° C. In one exemplary embodiment, the solvent is heated to a temperature in the range of about 60° C. to about 80° C. The photoresist may be exposed to the solvent for a time sufficient to remove at least substantially all of the photoresist. The time the photoresist is exposed to the solvent may be determined, at least in part, by the wet etch tool used. For example, using a batch wet etch tool, the photoresist may be exposed to the solvent bath for a period in the range of about 3-5 minutes if the bath is at about 80° C. Using a single-wafer wet etch tool, the solvent may be applied to the photoresist for 2-3 minutes if the solvent is at about 80° C.

After at least substantial removal of the photoresist, the metal-comprising material is rinsed using deionized water to remove any solvent residue (step 104). Typically after photoresist removal, a rinse of about 5 minutes is required to remove the photoresist-removal fluid. However, because the solvent has a high pH or no pH, a relatively short rinse, on the order of about 5 to about 20 seconds, can be utilized. Such a short rinse removes the solvent without any removal of the metal-containing material or its oxide. In an optional step, the metal-comprising material is dried after rinsing (step 106).

An aqueous-based fluid with a pH of at least about 9 then is applied to the metal-comprising material to remove any residual photoresist, organic material, and any other contaminants (step 108). As used herein, the term "aqueous-based fluid" means a fluid comprising at least about 50% water. By maintaining the pH of the aqueous-based fluid at no less than about 9, an at least substantially clean surface of the metal-comprising material gate electrode can be achieved without any removal of the gate electrode or its oxide, which removal can result in device degradation. A substantially clean metal-comprising material gate electrode surface permits high-integrity contact to the metal-comprising gate electrode, thus minimizing defectivity and threshold voltage shift and increasing product yield. Examples of suitable aqueous-based fluids having a pH no less than about 9 include, but are not limited to, tetramethylammonium hydroxide (TMAH), ammonia ($NH_3$), ammonium hydroxide ($NH_4OH$), ammonia/hydrogen peroxide mixture (APM), potassium hydroxide (KOH), SC1 (a known mixture of ammonium hydroxide, hydrogen peroxide, and water such as that available from Air Products and Chemicals, Inc. of Allentown, Pa.), methylamine ($CH_3NH_2$), aniline ($C_6H_5NH_2$), and ethylamine ($CH_3CH_2NY_2$). The aqueous-based fluid may be applied to the metal-comprising material gate electrode using any of the conventional techniques and/or wet etch tool described above for application of the non-aqueous-based solvent. To expedite cleaning, the fluid can be heated to above room temperature. In one exemplary embodiment, the fluid is heated to a temperature in the range of about 40° C. to about 65° C. The gate electrode may be exposed to the aqueous-based fluid for a time sufficient to remove at least substantially all of the photoresist residue, organic materials and other contaminants. For example, using a batch wet etch tool, the gate electrode may be exposed to a fluid bath for a period in the range of about from 3 to 10 minutes if the bath is in the range of about room temperature (about 15° C. to about 27° C.) to about 65° C. Using a single-wafer wet etch tool, the fluid may be applied for 30 seconds to about 1 minute if the fluid temperature is in the range of about from room temperature (about 15° C. to about 27° C.) to 65° C.

After application of the aqueous-based fluid, the metal-comprising material is rinsed using deionized water to remove any fluid residue (step 110). Because the fluid has a high pH, a relatively short rinse, on the order of about 5 to about 20 seconds, can be utilized. Such a short rinse removes the fluid without any removal of the metal-containing material or its oxide. The metal-comprising material gate electrode is dried after rinsing (step 112) and fabrication of the MOS device may continue in a conventional manner.

Accordingly, methods for removing photoresist form a metal-comprising material have been provided. The various embodiments of the methods comprise a two step process. A substantially non-aqueous-based solvent having a pH of no less than 9 or no pH is first applied to the photoresist to at least substantially remove the photoresist and an aqueous-based fluid having a pH of not less than about 9 then is applied to the metal-comprising material to clean it of residues and contaminants. Such methods provide for a clean metal-comprising material surface without any removal of the metal-comprising material or its oxide that can degrade the electrical characteristics of a subsequently-formed device. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for removing a photoresist from a metal-comprising material, the method comprising the steps of:
    applying to the photoresist a hydrocarbon-based solvent having no more than about 10% water and having a pH no less than about 9, wherein the hydrocarbon-based solvent demonstrates a contact angle of no greater than about 45 degrees when deposited on a hydrophobic surface; and
    subsequently applying to the metal-comprising material an aqueous-based fluid having a pH no less than about 9.

2. The method of claim 1, wherein the step of applying to the photoresist a hydrocarbon-based solvent comprises the step of applying a hydrocarbon-based solvent that has a Hansen solubility parameter with solubility components that are within 10% of each other.

3. The method of claim 1, wherein the step of applying to the photoresist a hydrocarbon-based solvent comprises applying a hydrocarbon-based solvent formed of a material selected from the group consisting of methyl isobutyl ketone, cyclohexanone, dichloromethane, ethyl glycol, polyethylene glycol, methyl hexanone, N-methylpyrrolidone, and N-methylpyrrolidone-comprising solvents, and alcohols.

4. The method of claim 1, further comprising the step of heating the hydrocarbon-based solvent to a temperature above room temperature before the step of applying to the photoresist the-hydrocarbon-based solvent.

5. The method of claim 4, wherein the step of heating comprises the step of heating the hydrocarbon-based solvent to a temperature in the range of about 60° C. to about 80° C.

6. The method of claim 1, further comprising the step of rinsing the metal-comprising material after the step of applying to the photoresist a hydrocarbon-based solvent and before the step of subsequently applying to the metal-comprising material an aqueous-based fluid.

7. The method of claim 6, further comprising the step of drying the metal-comprising material after the step of rinsing.

8. The method of claim 1, wherein the step of subsequently applying comprises the step of applying an aqueous-based fluid comprising a material selected from the group consisting of tetramethylammonium hydroxide, ammonia, ammonium hydroxide, ammonia/hydrogen peroxide mixture, potassium hydroxide, SC1, methylamine, aniline, and ethylamine.

9. The method of claim 1, further comprising the step of heating the aqueous-based fluid to a temperature in the range of about from 40° C. to about 65° C. before the step of subsequently applying to the metal-comprising material the aqueous-based fluid.

10. The method of claim 1, further comprising the step of rinsing and drying the metal-comprising material after the step of subsequently applying to the metal-comprising material the aqueous-based fluid.

11. The method of claim 1, wherein the step of subsequently applying to the metal-comprising material an aqueous-based fluid comprising the step of applying the aqueous-based fluid to the metal-comprising material selected from the group consisting of lanthanum and alloys thereof, aluminum and alloys thereof, magnesium and alloys thereof, titanium nitride, tantalum nitride, and tantalum carbide.

12. A method for forming a semiconductor device, the method comprising the steps of:
   depositing a metal-comprising material overlying a substrate;
   forming a patterned photoresist on the metal-comprising material;
   etching the metal-comprising material;
   at least substantially removing the patterned photoresist from the metal-comprising material using a hydrocarbon-based solvent having no more than about 10% water and having a pH no less than about 9, wherein the hydrocarbon-based solvent demonstrates a contact angle of no greater than about 45 degrees when deposited on a hydrophobic surface; and
   subjecting the metal-comprising material to an aqueous-based fluid having a pH no less than about 9.

13. The method of claim 12, wherein the step of at least substantially removing the patterned photoresist comprises the step of at least substantially removing the patterned photoresist with a hydrocarbon-based solvent that has a Hansen solubility parameter with solubility components that are within 10% of each other.

14. The method of claim 12, wherein the step of at least substantially removing the patterned photoresist comprises the step of at least substantially removing the patterned photoresist with a hydrocarbon-based solvent formed of a material selected from the group consisting of methyl isobutyl ketone, cyclohexanone, dichloromethane, ethyl glycol, polyethylene glycol, methyl hexanone, N-methylpyrrolidone, and N-methylpyrrolidone-comprising solvents, and alcohols.

15. The method of claim 12, further comprising the step of heating the hydrocarbon-based solvent to a temperature above room temperature before the step of substantially removing the patterned photoresist.

16. The method of claim 12, wherein the step of subjecting comprises applying to the metal-comprising material an aqueous-based fluid comprising a material selected from the group consisting of tetramethylammonium hydroxide, ammonia, ammonium hydroxide, ammonia/hydrogen peroxide mixture, potassium hydroxide, SC1, methylamine, aniline, and ethylamine.

17. The method of claim 12, wherein the step of depositing a metal-comprising material comprises the step of depositing a metal-comprising material selected from the group consisting of lanthanum and alloys thereof, aluminum and alloys thereof, magnesium and alloys thereof, titanium nitride, tantalum nitride, and tantalum carbide.

18. A method for forming a metal-comprising material gate electrode of a MOSFET, the method comprising the steps of:
   depositing a metal-comprising material overlying a high dielectric constant material;
   forming a patterned photoresist on the metal-comprising material;
   etching the metal-comprising material to form a metal-comprising material gate electrode;
   at least substantially removing the patterned photoresist from the metal-comprising material using a hydrocarbon-based solvent having no more than about 10% water and having a pH no less than about 9, wherein the hydrocarbon-based solvent demonstrates a contact angle of no greater than about 45 degrees when deposited on a hydrophobic surface;
   rinsing the metal-comprising material; and
   subjecting the metal-comprising material to an aqueous-based fluid having a pH no less than about 9.

* * * * *